United States Patent [19]

Habitz et al.

[11] Patent Number: 5,045,911
[45] Date of Patent: Sep. 3, 1991

[54] LATERAL PNP TRANSISTOR AND METHOD FOR FORMING SAME

[75] Inventors: Peter A. Habitz, Wappingers Falls; Chang-Ming Hsieh, Fishkill; Yi-Shiou Huang, Poughkeepsie, all of N.Y.

[73] Assignee: International Business Machines Corporation, Armonk, N.Y.

[21] Appl. No.: 608,609

[22] Filed: Oct. 30, 1990

Related U.S. Application Data

[62] Division of Ser. No. 317,877, Mar. 2, 1989, Pat. No. 4,996,164.

[51] Int. Cl.$^5$ .............................................. H01L 29/72
[52] U.S. Cl. ........................................ 357/35; 357/49; 357/89; 357/90
[58] Field of Search ..................... 357/35, 49, 89, 90

[56] References Cited

U.S. PATENT DOCUMENTS

| | | | |
|---|---|---|---|
| 4,005,451 | 1/1977 | Martinelli et al. | 357/35 |
| 4,045,251 | 8/1977 | Graul et al. | 148/1.5 |
| 4,283,236 | 8/1981 | Sirsi | 357/35 |
| 4,332,627 | 6/1982 | Schmitt et al. | 148/1.5 |
| 4,390,890 | 6/1983 | Bergeron et al. | 357/44 |
| 4,510,676 | 4/1985 | Anantha et al. | 29/577 C |
| 4,546,536 | 10/1985 | Anantha et al. | 29/571 |

OTHER PUBLICATIONS

IBM Technical Disclosure Bulletin, vol. 13, No. 6, Nov. 1970, by E. A. Valsamakis, "Lateral PNP with Gain Bandwidth Product", p. 1457.
IBM Technical Disclosure Bulletin, vol. 22, No. 7, Dec. 1979, by G. C. Feth et al., "Thin-Base Lateral PNP Transistor Structure", pp. 2939 through 2942.

Primary Examiner—Edward J. Wojcieckowicz
Attorney, Agent, or Firm—Jeffrey L. Brandt

[57] ABSTRACT

A process of forming a lateral PNP transistor includes the steps of: providing a chip of semiconductor material including an isolated N- device region; implanting N dopant material at a relatively low power and low dosage into a selected implant region of the device region; implanting N dopant material at a relatively higher power and higher dosage into the implant region; and forming emitter and collector regions in the device region such that an intrinsic base region is defined between the collector and emitter regions in the implant region.

10 Claims, 1 Drawing Sheet

LATERAL PNP TRANSISTOR AND METHOD FOR FORMING SAME

This application is a division of U.S. Ser. No. 317,877, filed 3/2/89, now U.S. Pat. No. 4,996,164.

The present invention relates generally to semiconductor devices and more particularly to a lateral PNP transistor and a method of making the same.

BACKGROUND OF THE INVENTION

It is known in the art to form lateral PNP transistors substantially concurrently with, and using processes compatible with, vertical NPN transistors. Due primarily to previous lithographic limitations, however, these lateral PNP transistors were fabricated with undesirably wide base widths, and exhibited poor operating characteristics relative to the vertical NPN transistors. The wide base widths typically resulted in lateral PNP transistors having poor frequency response, and low beta-gain.

Recent advances in lithographic technology now permit the fabrication of lateral PNP devices having sub-micron width base regions. However, these lateral transistors are typically formed on a low concentration N− epitaxial layer, the epitaxial layer concentration being dictated by the vertical NPN transistor requirements. As the base widths of the lateral PNP transistors are decreased in accordance with lithographic technology to improve frequency response and increase beta-gain, the low epitaxial layer concentration results in the problems of PFET collector current leakage, base current leakage, and emitter-collector punch-through.

IBM Technical Disclosure Bulletin, Vol. 13, No. 6, page 1457, November 1970, shows a method of fabricating a lateral PNP transistor wherein an N type diffusion is performed in an N- type epitaxial region before emitter and collector regions are formed. The emitter and collector regions are diffused into the N diffused epitaxial region so as to form a graded base region therebetween.

U.S. Pat. No. 4,510,676 to Anantha et al., assigned to the assignee of the present invention, shows a method of forming a lateral PNP transistor on an integrated circuit with and in a process compatible with the formation of a vertical NPN transistor.

IBM Technical Disclosure Bulletin, Vol. 22, No. 7, pgs. 2939-2942, December 1979, shows a method of forming a lateral PNP transistor structure wherein a silicon dioxide sidewall is used as a mask to form a thin base region. The sidewall is grown over the edge of a doped polysilicon layer. One electrode is formed by out-diffusion from the polysilicon layer into an underlying epitaxial region. The second electrode is formed by implantation, diffusion, or out-diffusion into the epitaxial region using the sidewall as a mask.

U.S. Pat. No. 4,005,451 to Martinelli et al. shows a lateral transistor wherein the collector and emitter region configurations and doping profiles are selected to promote current flow at a location spaced away from the device surface.

U.S. Pat. No. 4,283,236 to Sirsi is exemplary of "double-diffused" type lateral transistors, showing a lateral PNP transistor formed in an N- epitaxial region and having base and emitter regions both diffused through the same aperture. The region between the emitter and collector diffusions is counter-doped with a P type ion implant.

SUMMARY OF THE INVENTION

The principle object of the present invention is to provide a new and improved lateral PNP transistor.

Another object of the present invention is to provide a lateral PNP transistor of the abovedescribed type which can be formed on an N- substrate.

A further object of the present invention is to provide a lateral PNP transistor of the abovedescribed type which provides improved operating characteristics, including increased beta-gain and increased frequency response, relative to the prior art.

Yet another object of the present invention is to provide a method of forming a lateral PNP transistor which is compatible with the generally concurrent formation of a vertical NPN transistor.

In accordance with the present invention, there is provided a new and improved process of forming a lateral PNP transistor, the process comprising the steps of: providing a chip of semiconductor material including an isolated N- device region; implanting N dopant material at a relatively low power and low dosage into a selected implant region of the device region; implanting N dopant material at a relatively higher power and higher dosage into the implant region; and forming emitter and collector regions in the device region such that an intrinsic base region is defined between the collector and emitter regions in the implant region.

In accordance with another aspect of the present invention, there is provided a new and improved lateral PNP transistor, comprising: a chip of semiconductor material including an isolated N- device region; an N implant region formed in the device region; an emitter region of opposite conductivity type to the device region formed in the surface of the device region; and a collector region of same conductivity type as the emitter region formed in the surface of the device region; the emitter and collector regions spaced to define a base region therebetween in the implant region; the implant region having a relatively higher dopant concentration proximate the bottom of the emitter region and a relatively lower dopant concentration proximate the surface of the base region.

BRIEF DESCRIPTION OF THE FIGURES

Further objects, features, and advantages of the present invention will become apparent from a consideration of the following detailed description of the invention when read in conjunction with the drawing FIGs., in which.

DETAILED DESCRIPTION OF THE INVENTION

Figure 1:
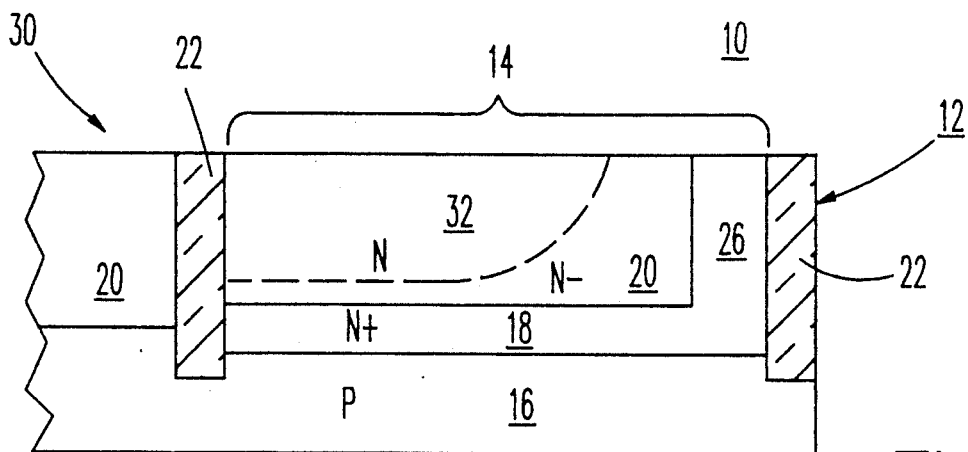
FIG. 1 shows a cross-sectional view at one step in the process of constructing a lateral PNP transistor in accordance with the present invention.

Referring now to the drawings, FIG. 1 shows a portion 10 of a semiconductor chip 12 including an isolated device region 14 formed over a P conductivity type substrate 16. Substrate 16 comprises, for example, a silicon wafer having a <100> crystallographic orientation and a resistivity in the range of about 15 ohm-cm.

An N+ buried subcollector region 18 is formed on the surface of substrate 16, and pursuant to a subsequent epitaxial growth step, extends upward into an overlying N- epitaxial layer 20. Buried subcollector region 18 is formed, for example, by a diffusion or ion implantation of arsenic ions into the surface of substrate 16 in a conventional manner during the fabrication process.

Epitaxial layer 20 is then grown, in a conventional chemical vapor deposition process, over the surface of P substrate 16 so as to yield a concentration in the range of about $1 \times 10^{16}$ atoms/cm$^3$. During the epitaxial growth of N− region 20, subcollector region 16 diffuses upwards into the overlying region to provide a subcollector concentration in the range of about $1 \times 10^{20}$ atoms/cm$^3$.

An isolation trench 22 extends from the surface of chip 12 downward to substrate 16, and bounds the edges of region 14 to electrically isolate the device formed therein from other devices on chip 12. Trench 22 is formed by conventional methods, for example by photolithographic masking, etching, filling, and planarizing. An N+ subcollector reachthrough region 26, formed, for example by deep ion implantation of phosphorus to a concentration in the range of about $1 \times 10^{20}$ atoms/cm$^3$, extends along the rightmost edge (as viewed in the FIGs.) of region 14 from the surface of the device downward into contact with subcollector region 18.

Generally concommitant with the formation of the structure in device region 14, a vertical NPN transistor (not shown) is fabricated in adjacent, electrically isolated device region 30.

Continuing with respect to FIG. 1, in accordance with the present invention, a two-step N+ ion implantation process is used to form an N implant region 32 within layer 20 and spaced from subcollector reachthrough region 26. The implantations are performed with a relatively light N+ type dopant, preferably Phosphorus.

The present inventors have determined that, through the use of the two step ion implantation process described herein, it is possible to provide lateral PNP transistors having vastly improved operating characteristics, without affecting the concurrently formed vertical NPN transistors.

To best illustrate the present invention, it will be described first for a device having an epitaxial layer concentration of about $1 \times 10^{16}$ atoms/cm3 (layer 20 as described above), an emitter region (the formation of which is shown below) having a depth into the epitaxial region of about 0.4 microns, and a base width W, as described below, of about 0.5 microns.

The first ion implantation is performed with a relatively high dopant concentration in the range of about $3 \times 10^{12}$ atoms/cm$^2$, and at a relatively high energy in the range of about 350 Kev. The second ion implantation is performed with a relatively lower dopant concentration in the range of about $8 \times 10^{11}$ atoms/cm$^2$, and at a relatively low energy in the range of about 100 Kev. It will be understood that, while for purposes of explanation the ion implantations have been referred to as first and second, they may be performed in either order with the same result.

Figure 2:
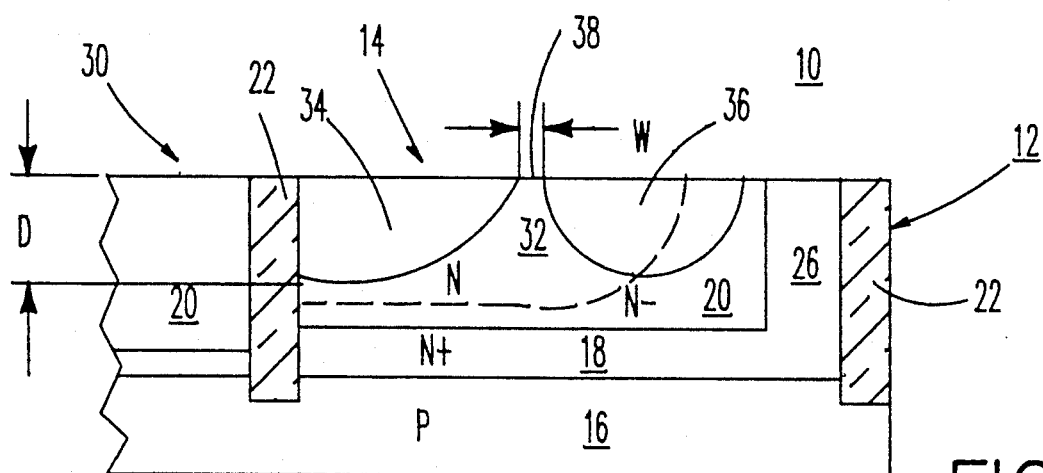
FIG. 2 shows a cross-sectional view at a later step in the fabrication of the lateral PNP transistor of FIG. 1.
Figure 3:
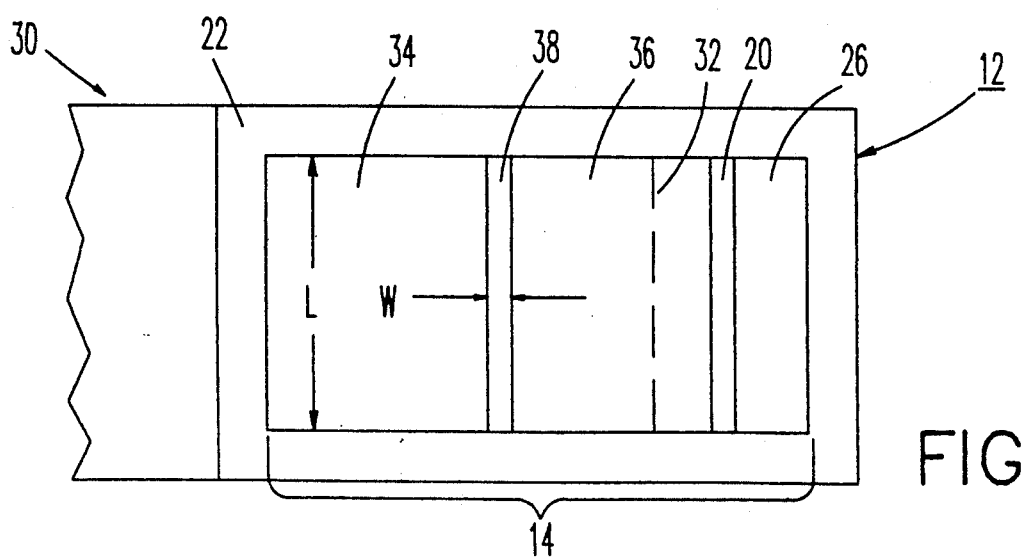
FIG. 3 is a top view of the device of FIG. 2.

Referring now to FIGS. 2 and 3, P type emitter and collector regions 34, 36, respectively, are formed in the surface of layer 20 such that the emitter region is contained entirely in the doped region 32, while the collector region overlaps at least a portion of the doped region. Emitter and collector regions 34, 36 are formed by conventional methods, such as masking and ion diffusion, with the emitter region having a depth D of about 0.4 microns. An intrinsic base region 38 is defined between the adjacent edges of the emitter and collector regions 34, 36, proximate the device surface. A heat anneal, for example at 900 degrees C. and for 40 minutes, is performed to activate the double ion implantation. The lateral PNP transistor thus formed in region 14 can be straightforwardly completed through the connections of conductive terminals (not shown).

When formed using the double ion implantation described above, N region 32 yields a surface concentration of about $5 \times 10^{16}$ atoms/cm$^3$, a concentration sufficient to provide adequate punch-through protection for a device having a base width W of about 0.50 microns. N region 32 further yields a higher concentration, of about $7 \times 10^{16}$ atoms/cm$^3$, proximate the bottom of emitter region 34. This higher concentration along the emitter-extrinsic base junction functions to inhibit the problems of base current leakage and PFET collector current leakage described above.

It is to be understood that the steps of forming the emitter, base, and N implant regions 34, 36, 32, respectively, can be performed in any selected order.

The present inventors have determined that, for a lateral PNP transistor formed in an N− region having a concentration of about $1 \times 10^{16}$ atoms/cm$^3$, and an emitter depth D of about 0.4 microns, base widths of from 0.10 to 1.0 microns can be achieved through appropriate selections within the following ranges: a first ion implantation having a relatively high energy level of about 350 Kev and a relatively high dose in the range of about $1 \times 10^{12}$–$2 \times 10^{13}$ atoms/cm$^2$, and a second ion implantation having a relatively low energy level of about 100 Kev and a relatively low dose in the range of about $2 \times 10^{11}$–$3 \times 10^{12}$ atoms/cm$^2$.

It will be appreciated that if the concentration of epitaxial layer 20, the desired base width W, or the depth D of emitter region 32 are varied, the parameters of the two ion implantations must be varied accordingly. The desired ion implantations will, of course, provide a doping profile which is greater proximate the bottom of the emitter region than at the surface. The doping concentration proximate the surface of the base region is selected to be sufficient to inhibit an emitter-collector punch-through breakdown of about 2 volts at 1 na/micron of emitter surface junction length L, but not so high as to unacceptably depress the transistor beta-gain. The doping concentration proximate the bottom of the emitter region is selected to be equal to or greater than about $7 \times 10^{16}$ atoms/cm$^3$.

There is thus provided a method for forming a lateral PNP transistor which exhibits substantially improved operating characteristics in comparison to similar prior art devices. The relatively narrow base width, e.g., 0.5 microns in the embodiment shown, yields a device having a beta-gain on the order of 50 for a collector current of 1 $\mu a/\mu m$, and a frequency response in the range of about 300 MHz. The dopant concentration in the intrinsic base region proximate the device surface is sufficient to inhibit emitter-collector punch-through, while the relatively higher dopant concentration in the vicinity of the bottom of the emitter region, i.e. along the emitter-extrinsic base junction, is sufficient to decreases base current and PFET collector current leakage.

The present invention provides these substantial benefits while requiring only one additional masking step; the masking step required to form implant region 32.

The invention is particularly applicable in the formation of lateral PNP transistors on semiconductor chips concurrently with the formation of vertical NPN transistors.

While the present invention has been described with respect to preferred embodiments, numerous modifications, changes, and improvements will occur to those skilled in the art without departing from the spirit and scope of the invention.

What is claimed is:

1. A lateral PNP transistor, comprising:
   a body of semiconductor material including an electrically isolated N− device region;
   an N implant region formed in said device region;
   an emitter region of opposite conductivity type to said device region formed in the surface of said N implant region; and
   a collector region of same conductivity type as said emitter region formed in the surface of said device region at least partially within said N implant region;
   said emitter and collector regions spaced to define a base region therebetween in said N implant region;
   said N implant region having a relatively higher dopant concentration proximate the bottom of said emitter region and a relatively lower dopant concentration proximate the surface of said base region.

2. A transistor in accordance with claim 1 wherein said emitter region is entirely in said implant region.

3. A transistor in accordance with claim 1 and further including:
   a P substrate underlying said device region; and
   an N+ buried subcollector region in the surface of said P substrate underlying said device region.

4. A transistor in accordance with claim 3 and further including an N+ reach-through region extending from the surface of said body to said N+ buried subcollector region.

5. A transistor in accordance with claim 4 wherein said implant region is deepest proximate the portion of said device region opposite said reach-through region and tapers off to the surface of said device region a predetermined distance from said reach-through region.

6. A transistor in accordance with claim 1 wherein said body comprises a silicon semiconductor material.

7. A transistor in accordance with claim 1 wherein said device region is selected to have a concentration of about $1 \times 10^{16}$ atoms/cm$^3$.

8. A transistor in accordance with claim 7 wherein:
   the ions used to dope said implant region are phosphorus ions; and
   said implant region formed by a two step ion implanting process, including
   a first implanting step selected to have a dosage in the range of about $2 \times 10^{11}$–$3 \times 10^{12}$ atoms/cm$^2$ and an energy of about 100 Kev, and
   a second implanting step selected to have a dosage in the range of about $1 \times 10^{12}$–$2 \times 10^{13}$ atoms/cm$^2$ and an energy of about 350 Kev.

9. A transistor in accordance with claim 1 wherein the concentration in said implant region proximate the surface of said base region is selected sufficient to inhibit an emitter-collector punch-through breakdown of about 2 volts at 1 nanoamp/micron of emitter surface length.

10. A transistor in accordance with claim 2 wherein the concentration in said implant region proximate the bottom of said emitter region is selected to be equal to or greater than about $7 \times 10^{16}$ atoms/cm$^3$.

* * * * *